United States Patent
Kim et al.

(10) Patent No.: US 9,562,287 B2
(45) Date of Patent: Feb. 7, 2017

(54) METHOD FOR PRODUCING HEXAGONAL BORON NITRIDE FILM USING BORAZINE OLIGOMER AS A PRECURSOR

(71) Applicant: KOREA INSTITUTE OF SCIENCE AND TECHNOLOGY, Seoul (KR)

(72) Inventors: Myung Jong Kim, Bongdong-eup (KR); Sungchan Park, Gunsan (KR); Hyunjin Cho, Bongdong-eup (KR); Sukang Bae, Gimhae (KR); Jin-Hyung Park, Seoul (KR); Jung Ho Kang, Yongin (KR); Sang Ook Kang, Yongin (KR); Changhyup Lee, Jeonju (KR)

(73) Assignee: KOREA INSTITUTE OF SCIENCE AND TECHNOLOGY, Seoul (KR)

(*) Notice: Subject to any disclaimer, the term of this patent is extended or adjusted under 35 U.S.C. 154(b) by 190 days.

(21) Appl. No.: 14/082,831

(22) Filed: Nov. 18, 2013

(65) Prior Publication Data

US 2015/0086460 A1 Mar. 26, 2015

(30) Foreign Application Priority Data

Sep. 24, 2013 (KR) .................. 10-2013-0113046

(51) Int. Cl.
*C23C 14/34* (2006.01)
*C23C 16/34* (2006.01)
(Continued)

(52) U.S. Cl.
CPC ............. *C23C 16/342* (2013.01); *C23C 14/34* (2013.01); *C23C 18/1204* (2013.01);
(Continued)

(58) Field of Classification Search
None
See application file for complete search history.

(56) References Cited

U.S. PATENT DOCUMENTS 4,581,468 A * 4/1986 Paciorek ............... C04B 35/583
423/290
4,970,095 A 11/1990 Bolt et al.
(Continued)

FOREIGN PATENT DOCUMENTS

CA 2083881 A1 5/1992
JP 2011-114162 A 9/2011
(Continued)

OTHER PUBLICATIONS

V. Z-H. Chan et al., "Characterization of boron nitride thin films prepared from a polymer precursor," *Journal of Materials Research*, vol. 11, No. 2, 1996, pp. 373-380.
(Continued)

*Primary Examiner* — Guinever S Gregorio
(74) *Attorney, Agent, or Firm* — Goldilocks Zone IP Law

(57) ABSTRACT

Provided is a method for producing a high-quality boron nitride film grown by using a borazine oligomer as a precursor through a metal catalyst effect. The method solves the problems, such as control of a gaseous precursor and vapor pressure control, occurring in CVD (Chemical vapor deposition) according to the related art, and a high-quality hexagonal boron nitride film is obtained through a simple process at low cost. In addition, the hexagonal boron nitride film may be coated onto various structures and materials. Further, selective coating is allowed so as to carry out coating in a predetermined area and scale-up is also allowed. Therefore, the method may be useful for coating applications of composite materials and various materials.

15 Claims, 8 Drawing Sheets

(51) Int. Cl.
*C23C 18/12* (2006.01)
*C23C 18/14* (2006.01)

(52) U.S. Cl.
CPC ...... *C23C 18/1233* (2013.01); *C23C 18/1241* (2013.01); *C23C 18/1245* (2013.01); *C23C 18/1275* (2013.01); *C23C 18/1283* (2013.01); *C23C 18/14* (2013.01)

(56) References Cited

U.S. PATENT DOCUMENTS

| | | |
|---|---|---|
| 4,971,779 A | 11/1990 | Paine, Jr. et al. |
| 5,188,757 A * | 2/1993 | Paine, Jr. ............... C04B 41/87 252/183.11 |
| 5,204,295 A | 4/1993 | Paine, Jr. et al. |
| 5,502,142 A | 3/1996 | Sneddon et al. |
| 6,025,454 A | 2/2000 | Sneddon et al. |
| 6,277,348 B1 | 8/2001 | Pujol et al. |
| 8,790,775 B2 | 7/2014 | Kim et al. |
| 2011/0256386 A1 | 10/2011 | Shi et al. |
| 2011/0293955 A1* | 12/2011 | Trowbridge ............ C23C 26/00 428/457 |

FOREIGN PATENT DOCUMENTS

| | | |
|---|---|---|
| KR | 95-013067 B1 | 6/1993 |
| KR | 10-2009-0124330 | 12/2009 |
| KR | 10-2010-0007217 | 1/2010 |
| KR | 10-2013-0032536 | 4/2013 |
| KR | 10-2013-0063410 | 6/2013 |

OTHER PUBLICATIONS

L-Y. Hong et al., "A Simple Nanocomposite Coating Process for Titanium Metal Surfaces Using a Polyborazine Precursor," *Journal of Industrial and Engineering Chemistry*, vol. 10, No. 6, 2004, pp. 936-939.

H. Termoss et al., "High purity boron nitride thin films prepared by the PDCs route," *Surface & Coatings Technology*, vol. 201, 2007, pp. 7822-7828.

* cited by examiner

Borazine oligomer,$(B_3N_3H_4)_x$ / Nickel       h-BN / Nickel

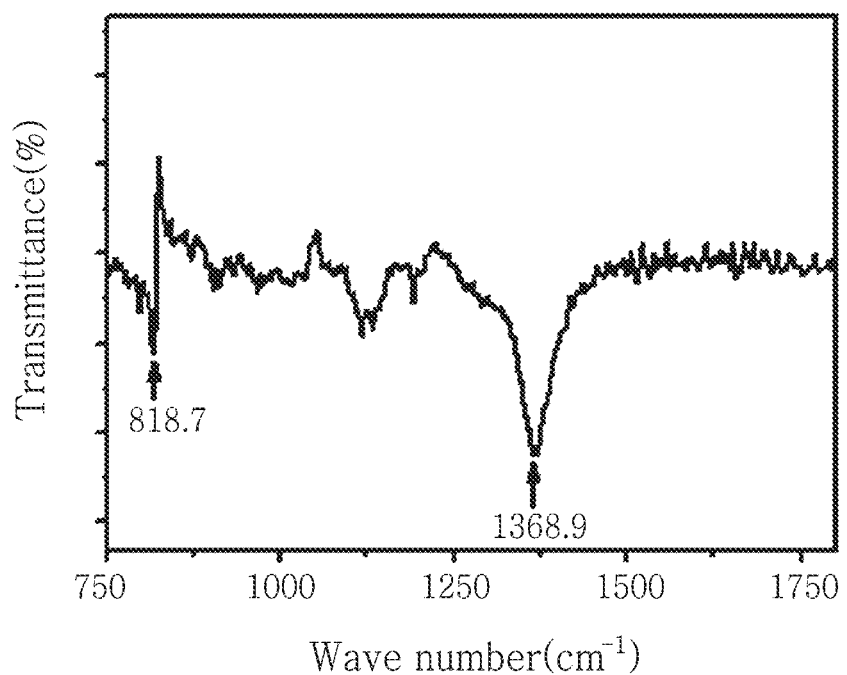

METHOD FOR PRODUCING HEXAGONAL BORON NITRIDE FILM USING BORAZINE OLIGOMER AS A PRECURSOR

CROSS-REFERENCE TO RELATED APPLICATION

This application claims priority to Korean Patent Application No. 10-2013-0113046, filed on Sep. 24, 2013, and all the benefits accruing therefrom under 35 U.S.C. §119, the contents of which in its entirety are herein incorporated by reference.

BACKGROUND

1. Field

The present disclosure relates to a method for producing a hexagonal boron nitride film by using a borazine oligomer as a precursor and a boron nitride film obtained thereby.

2. Description of the Related Art

Boron nitride (also referred to as BN hereinafter) is a material having a boron atom (atomic number 5) and a nitrogen atom (atomic number 7) bound to each other at a stoichiometric ratio of 1:1. Between the boron atom and the nitrogen atom bound to each other, a strong $sp^2$ covalent bonding is formed. In addition, weak van der waals force is present between two layers of boron nitride. Due to the difference in interatomic distance and in distance between two layers of boron nitride depending on bonding structures and types, different structures, such as cubic-boron nitride (c-BN), hexagonal-boron nitride (h-BN) and wurtzite-boron nitride (w-BN), are present.

Among those, hexagonal boron nitride (white graphene, h-BN) film is an insulator and is transparent and flexible. Basically, it is stable at high temperature, has thermal properties characterized by high heat conductivity, and shows mechanical properties, including a low elastic modulus and heat expansion coefficient, and high heat resistance and thermal shock resistance. In addition, such a hexagonal boron nitride film has a low dielectric constant and dielectric loss and shows a band gap of about 5.5-6.06 eV, thereby providing characteristics as a dielectric material. Meanwhile, it has a hexagonal structure, which is the same as the structure of graphene, a two-dimensional material having excellent physical properties and shows a lattice mismatch of merely about 1.7%, and thus may form various structures together with graphene. Therefore, by virtue of the excellent thermal properties, mechanical properties, electrical properties and structural characteristics as described above, a hexagonal BN film may be used for various industrial fields, and may be utilized particularly as a next-generation electronic material.

There are several methods for producing a hexagonal boron nitride film. Typical methods include a mechanical method, chemical exfoliation of bulk flake, vapor deposition using sputtering, ion implantation, atomic layer deposition (ALD), or the like. Particularly, chemical vapor deposition (CVD) method is used most frequently.

The mechanical method includes exfoliation of at least two layers of hexagonal boron nitride using Scotch tape. Upon exfoliation, weal van der waals force exists between two layers of boron nitride. Thus, the mechanical method is problematic in that it is limited in size of the exfoliated hexagonal boron nitride and in productivity.

The chemical exfoliation of bulk flake includes exfoliating bulk flake of hexagonal boron nitride by way of sonication in the presence of a solvent, such as dimethyl formamide and dichloroethane. The hexagonal boron nitride exfoliated by the chemical exfoliation has problems of its limited size and thickness control.

The CVD method includes gasifying borazine to allow its flow, decomposing borazine into boron and nitrogen at high temperature and allowing the reaction of boron and nitrogen on the surface of a specific metal catalyst substrate to form a hexagonal boron nitride film. The hexagonal boron nitride film obtained by the CVD method has low defects. However, the CVD method is problematic in that the film thus obtained has a different number of layers due to the difference in growth rate, an expensive gas controller or vacuum system is required, and gases showing a difficulty in handling are used.

REFERENCES OF THE RELATED ART

Patent Document (Patent Document 1) Korean Laid-Open Patent Publication No. 10-2009-0124330 (1996 Mar. 26)
(Patent Document 2) U.S. Pat. No. 5,502,142 (1996 Mar. 26)
(Patent Document 3) U.S. Pat. No. 6,025,454 (2000 Feb. 15)
(Patent Document 4) U.S. Pat. No. 4,970,095 (1990 Nov. 13)
(Patent Document 5) U.S. Pat. No. 4,971,779 (1990 Nov. 20)
(Patent Document 6) U.S. Pat. No. 5,204,295 (1993 Apr. 20)
(Patent Document 7) U.S. Pat. No. 6,277,348 (2001 Aug. 21)
(Patent Document 8) US Patent Application Laid-Open No. 2011-0256386 (2011 Oct. 20)

Non-Patent Document (Non-patent Document 1) Journal of Materials Research— L. G. Sneddon (1996) Vol. 11, No. 2, 373-380.
(Non-patent Document 2) Journal of Industry and Engineering Chemistry Dong-pyo Kim (2004) Vol. 10, No. 6, 936-939.
(Non-patent Document 3) Surface and Coatings Technology Berangere Toury (2007) 201, 7822-7828.

SUMMARY

The present disclosure is directed to providing a high-quality highly crystalline hexagonal boron nitride film and a method for producing the same. To solve the above-mentioned problems, a hexagonal boron nitride film is provided by dissolving a borazine oligomer into a solvent to form a boron nitride precursor solution and coating the boron nitride precursor solution onto a metal catalyst, followed by annealing.

In one aspect, there is provided a method for producing a boron nitride film, including:

mixing a borazine oligomer with an organic solvent to form a boron nitride precursor solution;

coating the boron nitride precursor solution onto a substrate; and carrying out phase transfer of the borazine oligomer in the coated boron nitride precursor solution to produce a hexagonal boron nitride film.

According to an embodiment, the substrate used for the coating may be a metal catalyst substrate. According to another embodiment, the method for producing a boron nitride film may further include, after the coating, depositing a metal catalyst onto the substrate coated with the boron nitride precursor solution.

In another aspect, there is provided a boron nitride film obtained by the above method.

According to the present disclosure, a borazine oligomer (($B_3N_3H_4$)$_x$) that is obtained by thermal oligomerization of borazine and is controllable in its viscosity is dissolved in a currently used solvent so that it may be used as a precursor. In this manner, the problems, such as control of a gaseous precursor and vapor pressure control, occurring in the CVD (Chemical vapor deposition) method according to the related art are solved, and a high-quality hexagonal boron nitride film is obtained through a simple process at low cost. In addition, the borazine oligomer may be coated onto a metal catalyst substrate or a metal catalyst may be deposited after coating so that a metal catalyst layer is positioned under or on the precursor. Subsequently, heat treatment is carried out to obtain a highly crystalline hexagonal boron nitride (h-BN) film having the same level as graphene formed of carbon, i.e., white graphene, on various structures and materials.

Further, selective coating is allowed so as to carry out coating in a predetermined area and scale-up is also allowed. Therefore, a high-quality hexagonal boron nitride film may be grown directly on electric materials, various substrates and composite materials such as carbon fibers, and thus functional coating may be accomplished.

BRIEF DESCRIPTION OF THE DRAWINGS

The above and other aspects, features and advantages of the disclosed exemplary embodiments will be more apparent from the following detailed description taken in conjunction with the accompanying drawings in which:

FIG. 5 shows lattice vibration absorption modes of the hexagonal boron nitride film obtained according to an embodiment and transferred onto a $SiO_2$/Si wafer substrate, as determined by Fourier transform infrared (FT-IR) analysis;

DETAILED DESCRIPTION

Figure 1:
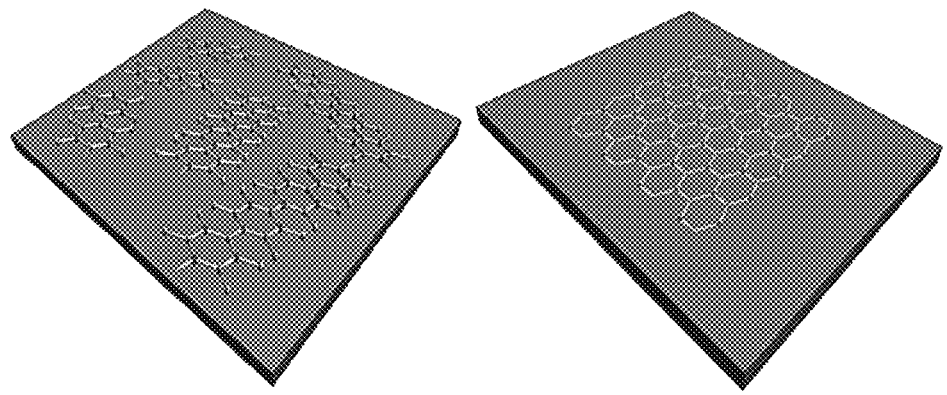
FIG. 1 is a schematic view showing a solubilized borazine oligomer coated on nickel and a hexagonal boron nitride film prepared on nickel.

Exemplary embodiments now will be described more fully hereinafter with reference to the accompanying drawings, in which exemplary embodiments are shown. The present disclosure may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art. In the description, details of well-known features and techniques may be omitted to avoid unnecessarily obscuring the presented embodiments.

In one aspect, there is provided a method for producing a boron nitride film, including:

mixing a borazine oligomer with an organic solvent to form a boron nitride precursor solution;

coating the boron nitride precursor solution onto a substrate; and carrying out phase transfer of the borazine oligomer in the coated boron nitride precursor solution to produce a hexagonal boron nitride film.

More particularly, according to an embodiment, the substrate used for the coating is a metal catalyst substrate, which is metal foil functioning as a catalyst or thin film having a catalyst metal deposited thereon. According to another embodiment, the method may further include, after coating the precursor solution onto a substrate, depositing a metal catalyst onto the coated precursor solution. In other words, the borazine oligomer in the boron nitride precursor solution is coated on the metal catalyst substrate or a metal catalyst is deposited after the coating so that the metal catalyst layer may be positioned under or on the precursor. In this manner, it is possible to obtain a high-quality highly crystalline hexagonal boron nitride film with ease as a result of phase transfer through activation energy.

According to an embodiment, the borazine oligomer used for the method for producing a boron nitride film is obtained by carrying out thermal oligomerization of borazine. According to another embodiment, the organic solvent used for forming the boron nitride precursor solution may be at least one selected from the group consisting of benzene, chlorobenzene, nitrobenzene, toluene, phenol, hexane and cyclohexane.

In addition, the method for producing a boron nitride film may further include, after forming the boron nitride precursor solution, aging the precursor solution thus formed to adjust the viscosity thereof. According to an embodiment, in order to control the viscosity while the precursor solution is aged, the precursor solution (the borazine oligomer in the boron nitride precursor solution) may be refrigerated at a temperature ranging from −24° C. to −36° C.

According to an embodiment, the substrate may be formed of at least one material selected from the group consisting of silicon, silicon oxide, sapphire, quartz, glass, graphite, indium oxide, polyacrylonitrile (PAN), polyethylene terephthalate (PET), polydimethylsiloxane (PDMS), polyethylene (PE), steel and carbon fibers. According to another embodiment, the metal of the metal catalyst substrate or the metal of the metal catalyst to be deposited on the precursor solution coated on the substrate may be at least one selected from the group consisting of nickel, palladium, platinum, copper, titanium, ruthenium, chrome, iron, aluminum, silver, and alloys thereof. According to still another embodiment, the metal catalyst may be deposited on the precursor solution coated on the substrate by at least one process selected from the group consisting of sputtering, thermal evaporation and electron beam evaporation.

According to an embodiment, the substrate may have a thickness of 100 nm to 40 µm. According to another embodiment, the metal catalyst substrate may be one treated by at least one process selected from the group consisting of annealing, electrochemical polishing and metal surface cleaning. For example, the metal surface cleaning may be performed by cleaning the metal substrate surface with at least one selected from the group consisting of a metal etchant, acetone, ethanol, methanol and isopropanol.

According to an embodiment, the coating operation in the method for producing a boron nitride film may be carried out under the condition of inert gas by at least one coating process selected from the group consisting of spin coating, spray coating, drop coating and dip coating. For example, the inert gas may be at least one selected from the group consisting of argon and nitrogen. According to another embodiment, after the coating, the method may further include baking the coated substrate to remove the organic solvent.

According to an embodiment, the phase transfer from the borazine oligomer to hexagonal boron nitride may be one using at least one type of energy selected from thermal energy, plasma, laser, electron beams, ion beams and UV irradiation. Particularly, the phase transfer may be carried out under the condition of at least one gas selected from argon, nitrogen, hydrogen, ammonia and helium. For example, the phase transfer may be carried out by using thermal energy through heat treatment at 800-1200° C. for 1-2 hours. During the heat treatment, the pressure in the reaction chamber may be controlled within a range of 100 mtorr-760 torr.

According to an embodiment, the method for producing a boron nitride film may further include transferring the obtained hexagonal boron nitride film to a substrate by using a polymeric protective film. Herein, the substrate may be formed of at least one material selected from the group consisting of silicon, silicon oxide, sapphire, quartz, glass, graphite, indium oxide, polyacrylonitrile (PAN), polyethylene terephthalate (PET), polydimethylsiloxane (PDMS), polyethylene (PE), steel and carbon fibers.

According to an embodiment, the method for producing a boron nitride film may further include treating the obtained hexagonal boron nitride film with at least one solution selected from the group consisting of ammonium persulfate, ferric chloride ($FeCl_3$), nitric acid, hydrochloric acid and sulfuric acid etching solutions in order to remove the metal catalyst deposited as an overlayer or the metal catalyst substrate layer as an underlayer.

In another aspect, there are provided a boron nitride film obtained by the method as described above, and an electronic material including the boron nitride film.

Hereinafter, two embodiments of the method for producing a boron nitride film, i.e., a method (Method I) for producing a boron nitride film including coating the borazine oligomer in the boron nitride precursor solution onto a metal catalyst substrate so that the metal catalyst layer may be positioned under the precursor, and a method (Method II) for producing a boron nitride film including depositing a metal catalyst after coating so that the metal catalyst layer may be positioned on the precursor will be described separately in a stepwise manner.

Method I

First, a borazine oligomer $(B_3N_3H_4)_x$ is prepared. The borazine oligomer to be prepared is not particularly limited but should be one that can be mixed with an organic solvent to form a boron nitride precursor solution.

According to an embodiment, the borazine oligomer $(B_3N_3H_4)x$ may be obtained by reacting ammonia borane ($NH_3BH_3$) with metal nanoparticles and tetraglyme at 80° C. to obtain borazine, which, in turn, is subjected to thermal oligomerization at a temperature of 70° C. for 48-60 hours.

In the above embodiment, the metal nanoparticles used for preparing borazine may serve to reduce the reaction temperature. For example, the metal nanoparticle may be at least one selected from the group consisting of Ni, Pd, Fe, Co, Cu, Au, Ag and Mn.

When preparing the borazine oligomer, it is possible to control the oligomerization degree by adjusting the time required for thermal oligomerization of borazine.

Next, the borazine oligomer thus obtained is mixed with an organic solvent to form a boron nitride precursor solution.

The organic solvent is not particularly limited, as long as it can be mixed with the borazine oligomer to form a boron nitride precursor solution.

According to an exemplary embodiment, the organic solvent may be at least one selected from the group consisting of benzene, chlorobenzene, nitrobenzene, toluene, phenol, hexane and cyclohexane. The organic solvent may be one capable of maintaining the chain structure of borazine oligomer and having adequate viscosity so as to increase the efficiency of the subsequent coating operation.

According to an exemplary embodiment, in order to control or optimize the viscosity of the boron nitride precursor solution (solubilized borazine oligomer), the method may further include aging the boron nitride precursor solution by refrigerating it at a temperature ranging from −24° C. to −36° C.

Then, the aged boron nitride precursor solution is coated onto a metal catalyst substrate.

For example, the metal of the metal catalyst substrate may be at least one selected from the group consisting of nickel, palladium, platinum, copper, titanium, ruthenium, chrome, iron, aluminum and silver, or an alloy thereof.

The catalyst reactivity and dehydrogenation degree vary with the particular type of the metal catalyst substrate, which affects the time and temperature required for carrying out heat treatment for the purpose of phase transfer.

Although there is no particular limitation in the thickness of the metal catalyst substrate, the metal catalyst substrate may have a thickness of 100 nm to 40 µm. The thickness of the metal catalyst substrate may affect etching during the subsequent transferring operation, and may be a factor that causes a difference in surface state after heat treatment.

According to an embodiment, the metal catalyst substrate may be one treated by at least one process selected from the group consisting of annealing, electrochemical polishing and metal surface cleaning, before it is coated with the boron nitride precursor solution.

According to another embodiment, the metal surface cleaning may be performed by cleaning the metal substrate surface with at least one selected from the group consisting of a metal etchant, acetone, ethanol, methanol and isopropanol.

When the precursor solution is coated onto the metal catalyst substrate, the coating operation may be carried out under the condition of inert gas by at least one coating process selected from the group consisting of spin coating, spray coating, drop coating and dip coating. In the coating operation, the inert gas may be at least one selected from the group consisting of argon and nitrogen, or a mixed gas thereof.

According to still another embodiment, after the precursor solution is coated onto the metal catalyst substrate, the method may further include baking the coated metal catalyst substrate to remove the organic solvent. The baking operation is not particularly limited but may be carried out by heat treatment within a temperature range of 150-200° C. for 5-30 minutes. By virtue of such baking operation, it is possible to remove the organic solvent, to minimize the risk of reaction of the boron nitride film precursor upon its exposure to air, and to reduce the loss of precursor mass during the subsequent phase transfer.

After the completion of the coating operation, the borazine oligomer coated on the metal catalyst substrate is allowed to undergo phase transfer to obtain a hexagonal boron nitride film.

The phase transfer is not particularly limited, as long as it allows conversion from the solubilized and dried borazine oligomer into a hexagonal boron nitride film. For example, the phase transfer may be one using at least one type of energy selected from thermal energy, plasma, laser, electron beams, ion beams and UV energy.

As an activation energy source for the phase transfer, it is possible to apply various energy sources to the borazine oligomer coating film in addition to thermal energy.

According to an exemplary embodiment, for the heat treatment through a thermal process, the phase transfer may be carried out by heat treatment at 800-1200° C. for 1-2 hours. During the heat treatment under the above conditions, the borazine oligomer having low crystallinity may undergo phase transfer into a highly crystalline hexagonal boron nitride film. In addition, during the heat treatment, the pressure in the reaction chamber may be controlled within a range of 100 mtorr-760 torr.

The phase transfer from the borazine oligomer to hexagonal boron nitride may be carried out under gaseous atmosphere. For example, the gas atmosphere for the phase transfer may be at least one gas selected from argon, nitrogen, hydrogen, ammonia and helium, or a mixed gas thereof. The gaseous atmosphere may affect the phase transfer reaction rate. When using hydrogen or nitrogen alone, it is possible to accelerate the phase transfer reaction. However, in this case, reverse-reaction may occur undesirably. Therefore, it is important to control the atmosphere as desired.

According to an embodiment, the method may further include treating the hexagonal boron nitride film obtained through the phase transfer with at least one solution selected from the group consisting of ammonium persulfate, ferric chloride ($FeCl_3$), nitric acid, hydrochloric acid and sulfuric acid etching solutions in order to remove the metal substrate layer as an underlayer of the hexagonal boron nitride film.

According to an embodiment, the method may further include transferring the hexagonal boron nitride film obtained through the phase transfer to a substrate by using a polymeric protective film. Herein, the polymer serving as a protective film may be poly(methyl methacrylate), polydimethylsiloxane, or the like. The use of such a polymeric protective film allows selective etching of the metal catalyst substrate alone. Thus, it is possible to transfer the hexagonal boron nitride film to a predetermined substrate.

The substrate for use in the transferring operation is not particularly limited, but particular examples thereof include substrates made of at least one material selected from the group consisting of silicon, silicon oxide, sapphire, quartz, glass, graphite, indium oxide, polyacrylonitrile (PAN), polyethylene terephthalate (PET), polydimethylsiloxane (PDMS), polyethylene (PE), steel and carbon fibers.

The hexagonal boron nitride film obtained by the method including the operations as describe above has high quality, and is produced more efficiently at lower cost as compared to the CVD process according to the related art so as to allow mass production.

In addition, the hexagonal boron nitride film thus obtained may be applied to various materials, such as dielectric materials of transistor devices or memory devices. Further, it may be applied to printing processes, electronic materials, composite materials, or the like.

Then, Method II will be explained in a stepwise manner.

Method II

In the same manner as described in Method I, a borazine oligomer is prepared, the borazine oligomer thus prepared is mixed with an organic solvent to form a boron nitride precursor solution, and the precursor solution thus formed is aged to control the viscosity thereof.

After the aging, the aged boron nitride precursor solution is coated onto a substrate. The precursor solution may be coated onto a predetermined substrate. The substrate is not particularly limited, but particular examples thereof include substrates made of at least one material selected from the group consisting of silicon, silicon oxide, sapphire, quartz, glass, graphite, indium oxide, polyacrylonitrile (PAN), polyethylene terephthalate (PET), polydimethylsiloxane (PDMS), polyethylene (PE), steel and carbon fibers. In addition, the substrate is not particularly limited, as long as it is one requiring protective or functional coating.

When the precursor solution is coated onto the substrate, the coating operation may be carried out under the condition of inert gas by at least one coating process selected from the group consisting of spin coating, spray coating, drop coating and dip coating. In the coating operation, the inert gas may be at least one selected from the group consisting of argon and nitrogen, or a mixed gas thereof.

After the precursor solution is coated onto the substrate, the method may further include baking the coated substrate to remove the organic solvent. The baking operation is not particularly limited but may be carried out by heat treatment within a temperature range of 150-200° C. for 5-30 minutes. By virtue of such baking operation, it is possible to remove the organic solvent, to minimize the risk of reaction of the boron nitride film precursor upon its exposure to air, and to reduce the loss of precursor mass during the subsequent phase transfer.

After the completion of the coating operation, a metal catalyst is deposited on the borazine oligomer coated on the substrate, and the borazine oligomer is allowed to undergo phase transfer to obtain a hexagonal boron nitride film.

For example, the metal of the metal catalyst may be at least one selected from the group consisting of nickel, palladium, platinum, copper, titanium, ruthenium, chrome, iron, aluminum and silver, or an alloy thereof.

When the metal catalyst is deposited on the substrate, the deposition process is not particularly limited but may be carried out by at least one selected from the group consisting of sputtering, thermal evaporation and electron beam evaporation.

After the completion of the deposition of the metal catalyst, phase transfer is carried out. The phase transfer is not particularly limited, as long as it allows conversion from the solubilized and dried borazine oligomer into a hexagonal boron nitride film. For example, the phase transfer may be one using at least one type of energy selected from thermal energy, plasma, laser, electron beams, ion beams and UV energy.

As an activation energy source for the phase transfer, it is possible to apply various energy sources to the borazine oligomer coating film in addition to thermal energy.

According to an exemplary embodiment, for the heat treatment through a thermal process, the phase transfer may be carried out by heat treatment at 800-1200° C. for 1-2 hours. During the heat treatment under the above conditions, the borazine oligomer having low crystallinity may undergo phase transfer into a highly crystalline hexagonal boron nitride film. In addition, during the heat treatment, the pressure in the reaction chamber may be controlled within a range of 100 mtorr-760 torr.

The phase transfer from the borazine oligomer to hexagonal boron nitride may be carried out under gaseous atmosphere. For example, the gas atmosphere for the phase transfer may be at least one gas selected from argon, nitrogen, hydrogen, ammonia and helium, or a mixed gas thereof. The gaseous atmosphere may affect the phase transfer reaction rate. When using hydrogen or nitrogen alone, it is possible to accelerate the phase transfer reaction. However, in this case, reverse-reaction may occur undesirably. Therefore, it is important to control the atmosphere as desired.

According to an embodiment, the method may further include treating the hexagonal boron nitride film obtained through the phase transfer with at least one solution selected from the group consisting of ammonium persulfate, ferric chloride ($FeCl_3$), nitric acid, hydrochloric acid and sulfuric acid etching solutions in order to remove the metal catalyst deposited as an overlayer of the hexagonal boron nitride film.

The hexagonal boron nitride film obtained by the method including the operations as describe above has high quality, and is produced more efficiently at lower cost as compared to the CVD process according to the related art so as to allow mass production.

In addition, the hexagonal boron nitride film thus obtained may be applied to various materials, such as dielectric materials of transistor devices or memory devices. Further, it may be applied to printing processes, electronic materials, composite materials, or the like.

EXAMPLES

The examples and experiments will now be described. The following examples and experiments are for illustrative purposes only and not intended to limit the scope of the present disclosure.

Example 1

A solubilized borazine oligomer (boron nitride precursor solution) is used to prepare a hexagonal boron nitride film. For this, a borazine oligomer (($B_3H_3H_4)_x$) is prepared through the thermal oligomerization of borazine.

Next, the borazine oligomer is mixed with chlorobenzene to obtain a boron nitride precursor solution optimized for coating.

As a metal catalyst substrate, nickel foil is provided. The nickel foil is treated by electrochemical polishing under the condition of 2 volt for 20 minutes. Then, metal surface treatment is carried out through a 5-minute cleaning process including introduction into acetone and ethanol, followed by sonication.

The solubilized borazine oligomer is coated onto the metal catalyst substrate through spin-coating under the condition of 9000 rpm. Then, baking is carried out at 150° C. for 20 minutes.

Then, the borazine oligomer coated on the metal catalyst substrate is subjected to heat treatment by increasing the temperature to 1000° C. and carrying out heat treatment under argon (Ar) atmosphere at a pressure of 600 mtorr for 1 hour, followed by cooling for 2 hours.

Example 2

A solubilized borazine oligomer (boron nitride precursor solution) is used to prepare a hexagonal boron nitride film. For this, a borazine oligomer (($B_3H_3H_4)_x$) is prepared through the thermal oligomerization of borazine.

Next, the borazine oligomer is mixed with chlorobenzene to obtain a boron nitride precursor solution optimized for coating.

The solubilized borazine oligomer is coated onto a silicon substrate through spin-coating under the condition of 9000 rpm. Then, baking is carried out at 150° C. for 20 minutes.

Then, a nickel metal catalyst is deposited on the borazine oligomer coated on the silicon substrate trough electron beam evaporation.

Then, the borazine oligomer coated on the metal catalyst substrate is subjected to heat treatment by increasing the temperature to 1000° C. and carrying out heat treatment under argon (Ar) atmosphere at a pressure of 600 mtorr for 1 hour, followed by cooling for 2 hours.

Figure 2:
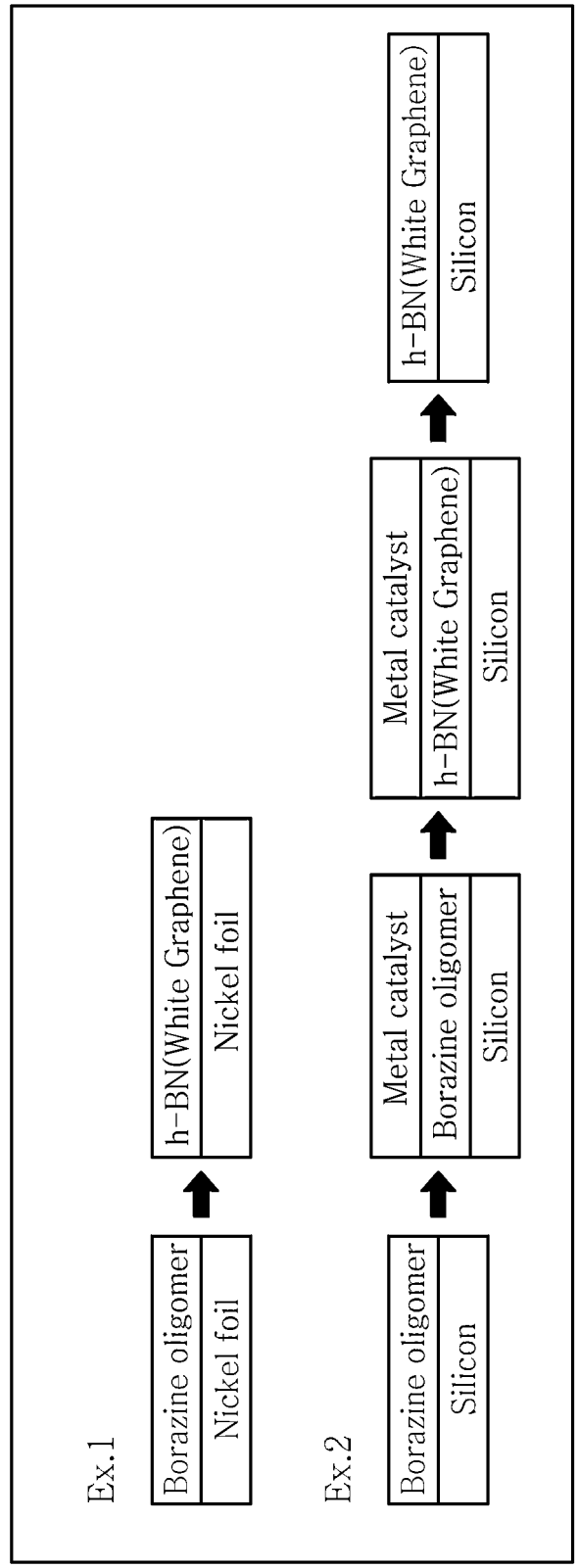
FIG. 2 is a schematic view illustrating Method I and Method II according to an embodiment of the present disclosure.

Example 1 and Example 2 are illustrated schematically in FIG. 2.

Test Example 1

In order to transfer the hexagonal boron nitride film obtained from Example 1 to a $SiO_2$/Si substrate, poly (methyl methacrylate) is spin-coated on the hexagonal boron nitride film as a polymeric protective film. $FeCl_3$ is used as an etchant solution, to remove the nickel catalyst substrate. After etching, rinsing is carried out several times with tertiary distilled water to transfer the hexagonal boron nitride film to the $SiO_2$/Si substrate. Then, the hexagonal boron nitride film is immersed into acetone to remove poly(methyl methacrylate), and then rinsed several times with tertiary distilled water, followed by drying in an oven at 50° C.

Figure 3:
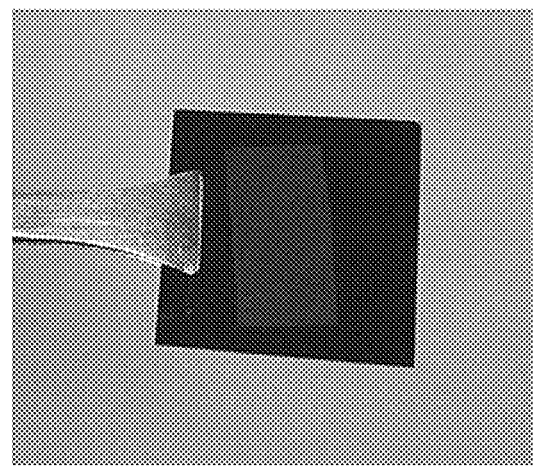
FIG. 3 is a photographic image showing the hexagonal boron nitride film obtained according to an embodiment and transferred on a $SiO_2$/Si wafer substrate.

The photographic image of the hexagonal boron nitride film prepared on the $SiO_2$/Si substrate in the manner as described above is shown in FIG. 3.

Test Example 2

Figure 4:
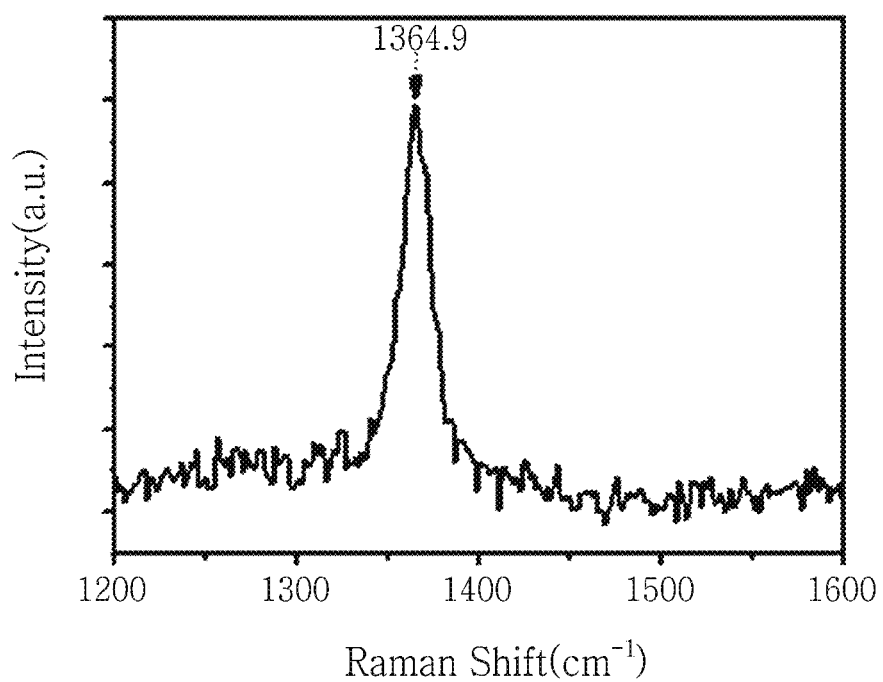
FIG. 4 shows lattice vibration scattering modes of the hexagonal boron nitride film obtained according to an embodiment and transferred onto a $SiO_2$/Si wafer substrate, as determined by Raman analysis.

The hexagonal boron nitride film obtained from Example 1 is subjected to Raman spectroscopy, and the scattering modes of lattice vibration of the hexagonal boron nitride film are shown in FIG. 4. As the position of the lattice vibration mode of boron and nitrogen in the hexagonal boron nitride film, 1364 $cm^{-1}$ is checked.

Test Example 3

The hexagonal boron nitride film obtained from Example 1 is subjected to Fourier transform infrared (FT-IR) analysis, and the absorption modes of lattice vibration of the hexagonal boron nitride film are shown in FIG. 5. As the position of the in-plane stretching vibration mode of boron and nitrogen in the hexagonal boron nitride film, 1368 cm$^{-1}$ is checked. In addition, as the position of the out-of plane bending vibration mode of boron and nitrogen, 818 cm$^{-1}$ is checked.

Test Example 4

Figure 6A:
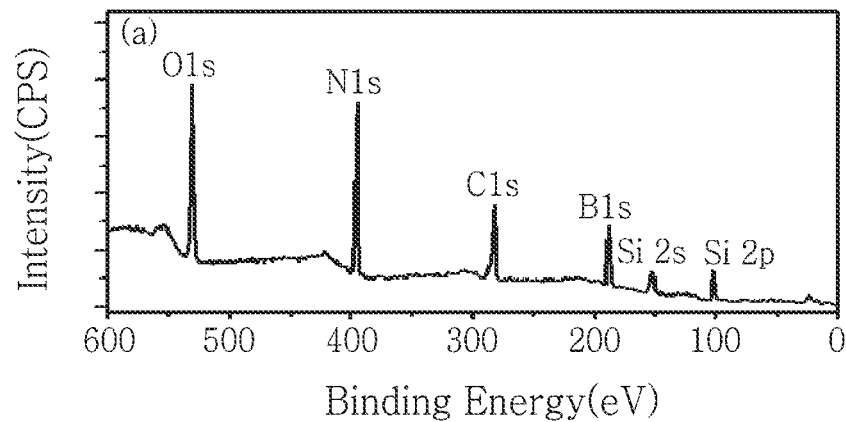
FIG. 6a shows the results of qualitative elemental analysis of the hexagonal boron nitride film obtained according to an embodiment and transferred onto a $SiO_2$/Si wafer substrate, as determined by X-ray photoelectron spectroscopy (XPS)

The hexagonal boron nitride film obtained from Example 1 is subjected to X-ray photoelectron spectroscopy (XPS), and the results of qualitative elemental analysis of the hexagonal boron nitride film are shown in FIG. 6. It can be seen from the results of elemental analysis that oxygen and silicon are derived from the substrate.

Figure 6B:
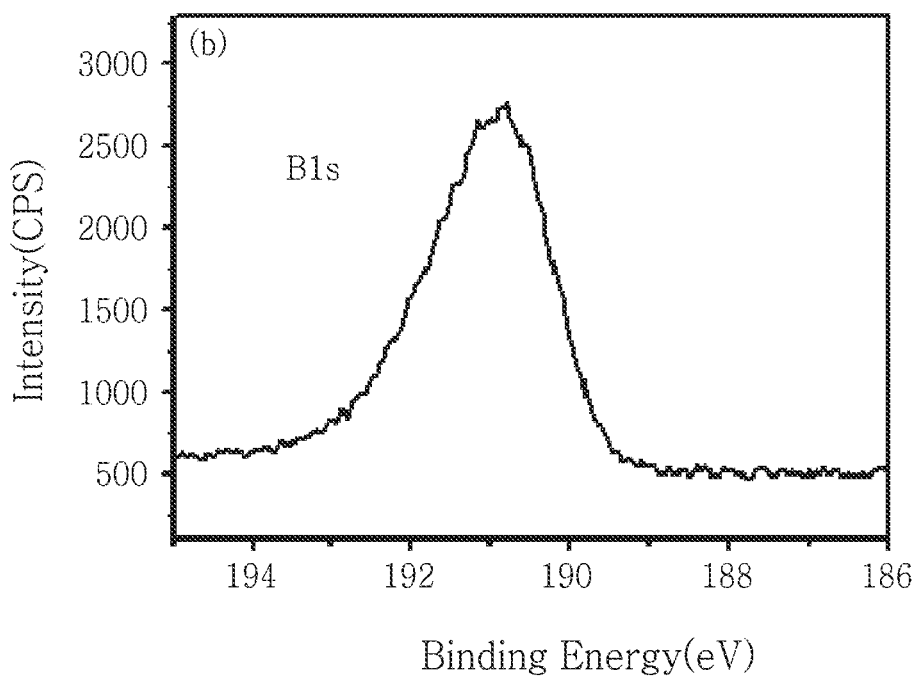
FIG. 6b shows the element of boron (B) 1s of the hexagonal boron nitride film obtained according to an embodiment and transferred onto a $SiO_2$/Si wafer substrate, as determined by XPS.
Figure 6C:
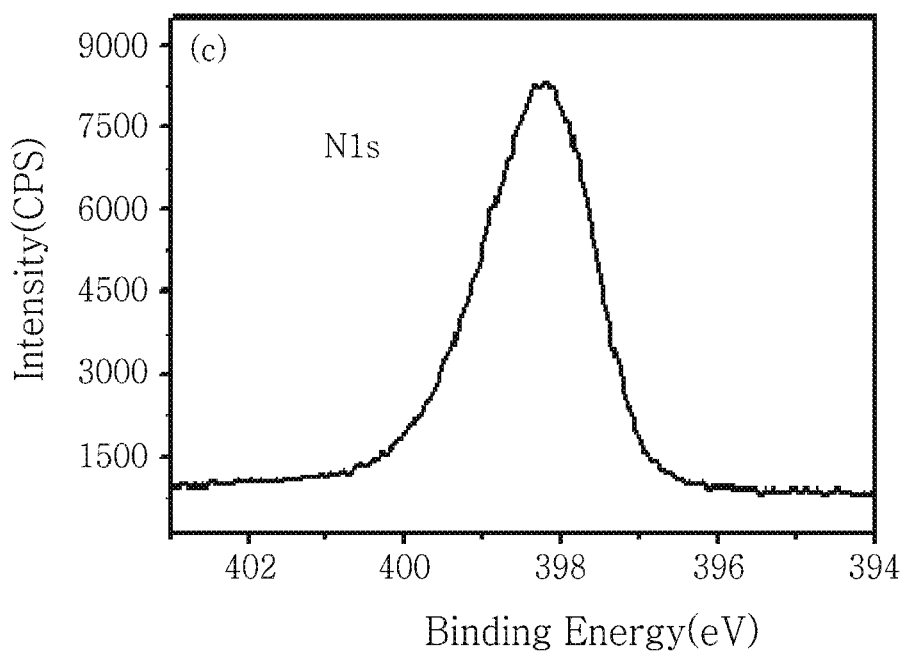
FIG. 6c shows the element of nitrogen (N) 1s of the hexagonal boron nitride film obtained according to an embodiment and transferred onto a $SiO_2$/Si wafer substrate, as determined by XPS.
Figure 7:
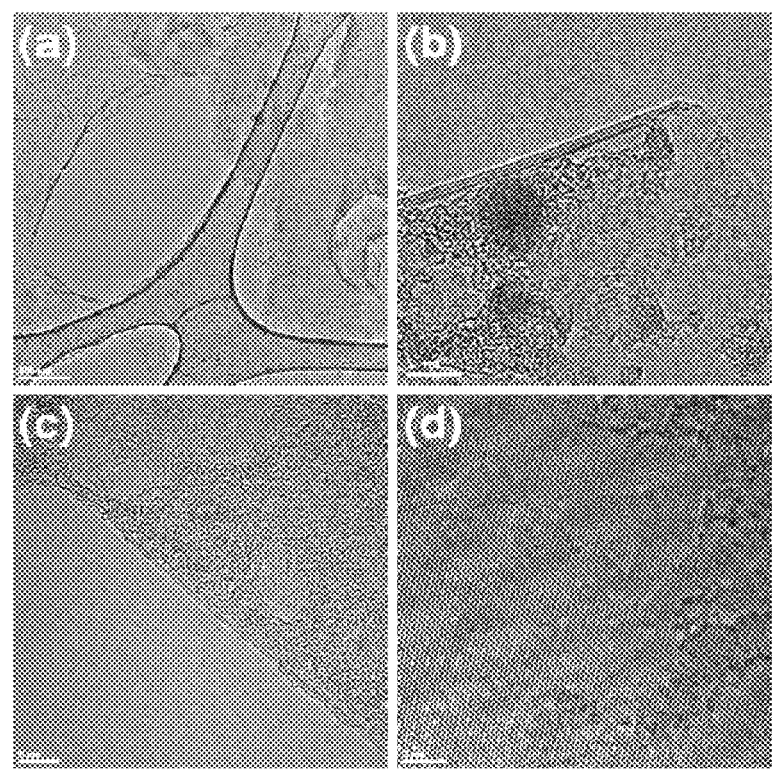
FIG. 7(a)-FIG. 7(d) show the interlayer structure of the hexagonal boron nitride film obtained according to an embodiment, as determined by transmission electron microscope (TEM) analysis.
Figure 8:
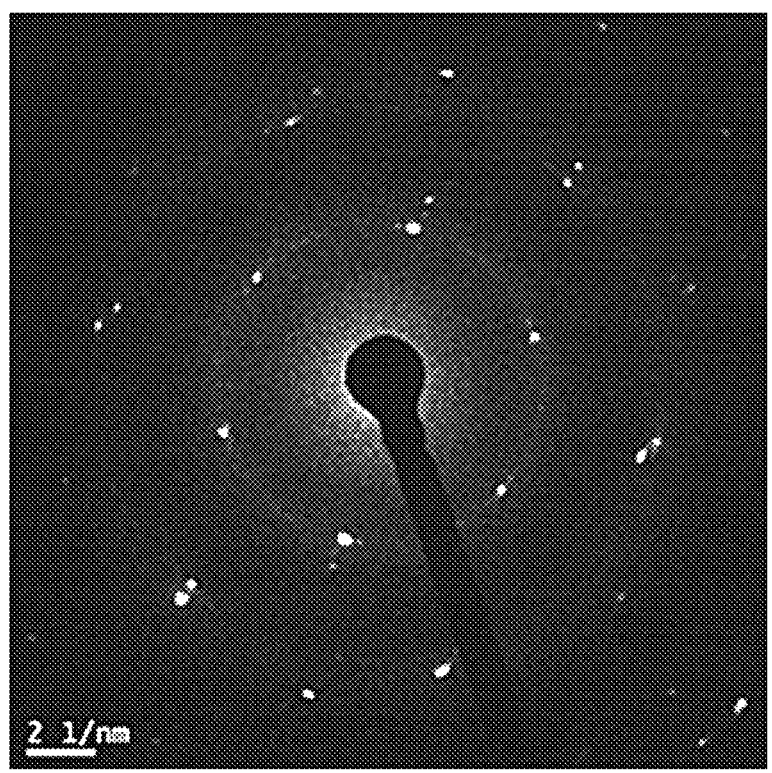
FIG. 8 shows the hexagonal structure of the hexagonal boron nitride film obtained according to an embodiment, as determined by selected area electron diffraction (SAED)

As can be seen from FIGS. 6b and 6c, the elemental binding energy of B 1s and that of N 1s are 190.75 eV and 398.2 eV, respectively.

Test Example 5

Figure 9:
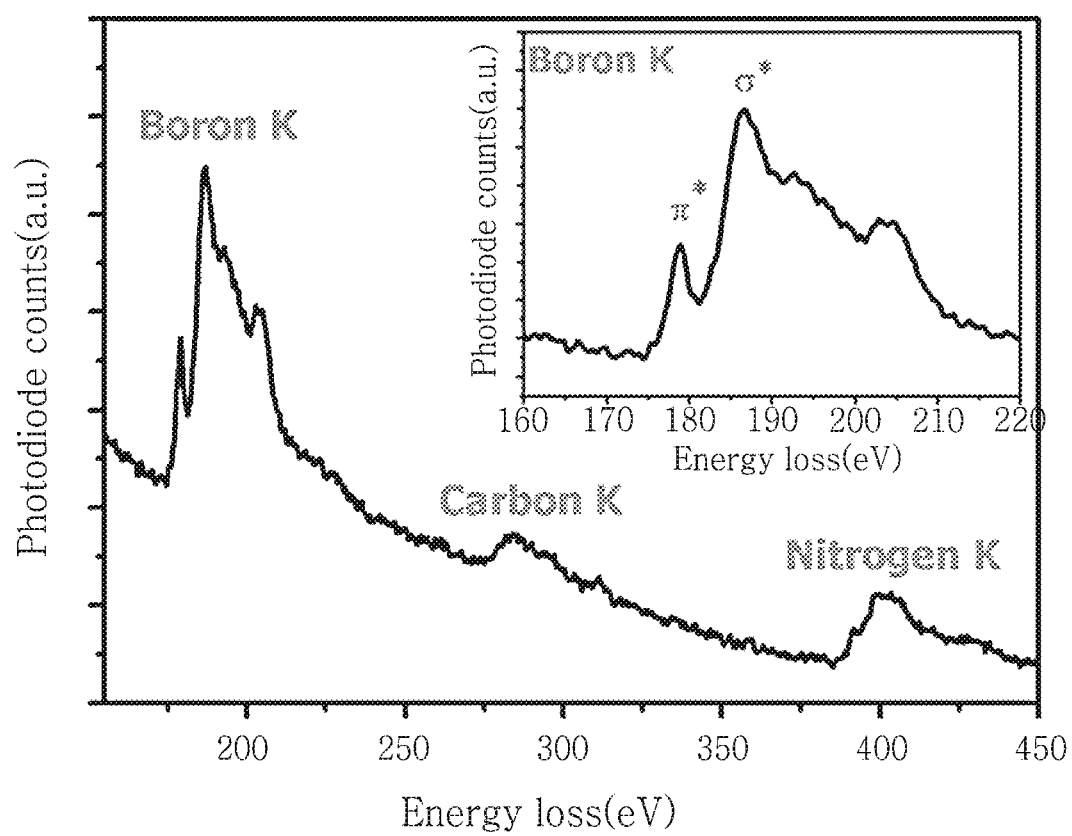
FIG. 9 shows the $sp^2$ bonding of the hexagonal boron nitride film obtained according to an embodiment, as determined by electron energy loss spectroscopy (EELS).

The hexagonal boron nitride film obtained from Example 1 is subjected to electron energy loss spectroscopy (EELS) and sp$^2$ bonding is shown in FIG. 9.

While the exemplary embodiments have been shown and described, it will be understood by those skilled in the art that various changes in form and details may be made thereto without departing from the spirit and scope of the present disclosure as defined by the appended claims. In addition, many modifications can be made to adapt a particular situation or material to the teachings of the present disclosure without departing from the essential scope thereof. Therefore, it is intended that the present disclosure not be limited to the particular exemplary embodiments disclosed as the best mode contemplated for carrying out the present disclosure, but that the present disclosure will include all embodiments falling within the scope of the appended claims.

What is claimed is:

1. A method for producing a high-quality and highly crystalline hexagonal boron nitride film for electronic materials, comprising:
   mixing a borazine oligomer with an organic solvent to form a boron nitride precursor solution;
   aging the precursor solution at a temperature ranging from −24° C. to −36° C. to adjust the viscosity thereof;
   coating the boron nitride precursor solution onto a substrate; and
   carrying out phase transfer of the borazine oligomer in the coated boron nitride precursor solution to produce a hexagonal boron nitride film on the substrate,
   wherein the substrate in said coating is a metal catalyst substrate,
   wherein said phase transfer is carried out by using thermal energy through heat treatment at 1000-1100° C.,
   wherein the metal catalyst substrate is a metal foil, and wherein the metal catalyst substrate has a thickness of 100 nm to 40 µm.

2. The method for producing a boron nitride film according to claim 1, wherein the borazine oligomer is obtained by carrying out thermal oligomerization of borazine.

3. The method for producing a boron nitride film according to claim 1, wherein the metal of the metal catalyst substrate is at least one selected from the group consisting of nickel, palladium, platinum, copper, titanium, ruthenium, chrome, iron, aluminum, and silver.

4. The method for producing a boron nitride film according to claim 1, wherein the metal catalyst substrate is one treated by at least one process selected from the group consisting of annealing, electrochemical polishing and metal surface cleaning.

5. The method for producing a boron nitride film according to claim 1, wherein said coating is carried out under the condition of inert gas by at least one coating process selected from the group consisting of spin coating, spray coating, drop coating and dip coating.

6. The method for producing a boron nitride film according to claim 1, which further comprises, after said coating, baking the coated substrate to remove the organic solvent.

7. The method for producing a boron nitride film according to claim 1, wherein said phase transfer from the borazine oligomer to hexagonal boron nitride comprises a process using at least one type of energy selected from thermal energy, plasma, laser, electron beams, ion beams and UV irradiation.

8. The method for producing a boron nitride film according to claim 7, wherein said phase transfer is carried out under the condition of at least one gas selected from argon, nitrogen, hydrogen, ammonia and helium.

9. The method for producing a boron nitride film according to claim 7, wherein said phase transfer is carried out by using thermal energy through heat treatment for 1-2 hours.

10. The method for producing a boron nitride film according to claim 9, wherein the pressure in the reaction chamber during the heat treatment is within a range of 100 mtorr-760 torr.

11. The method for producing a boron nitride film according to claim 1, which further comprises transferring the hexagonal boron nitride film to a substrate by using a polymeric protective film.

12. A method for producing a high-quality and highly crystalline boron nitride film for electronic materials comprising:
   mixing a borazine oligomer with an organic solvent to form a boron nitride precursor solution; and
   aging the precursor solution at a temperature raging from −24° C. to −36° C. to adjust the viscosity thereof;
   coating the boron nitride precursor solution onto a substrate;
   depositing a metal catalyst onto the substrate coated with the boron nitride precursor solution; and
   carrying out phase transfer of the borazine oligomer in the coated boron nitride precursor solution to produce a hexagonal boron nitride film,
   wherein the substrate is formed of at least one material selected from the group consisting of silicon, silicon oxide, sapphire, quartz, glass, graphite, indium oxide, polyacrylonitrile (PAN), polyethylene terephthalate (PET), polydimethylsiloxane (PDMS), polyethylene (PE), steel and carbon fibers,
   wherein said phase transfer is carried out by using thermal energy through heat treatment at 1000-1100° C.

13. The method for producing a boron nitride film according to claim 12, which further comprises treating the hexagonal boron nitride film with at least one solution selected from the group consisting of ammonium persulfate, ferric chloride (FeCl3), nitric acid, hydrochloric acid and sulfuric acid etching solutions in order to remove the metal catalyst deposited as an overlayer of the hexagonal boron nitride film.

14. The method for producing a boron nitride film according to claim 12, wherein said deposition is carried out by at least one process selected from the group consisting of sputtering, thermal evaporation and electron beam evaporation.

15. The method for producing a boron nitride film according to claim 12, wherein the metal catalyst is at least one selected from the group consisting of nickel, palladium, platinum, copper, titanium, ruthenium, chrome, iron, aluminum, and silver.

\* \* \* \* \*